US008144540B2

(12) United States Patent
Liaw

(10) Patent No.: US 8,144,540 B2
(45) Date of Patent: Mar. 27, 2012

(54) TWO-PORT 8T SRAM DESIGN

(75) Inventor: Jhon-Jhy Liaw, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 235 days.

(21) Appl. No.: 12/694,063

(22) Filed: Jan. 26, 2010

(65) Prior Publication Data

US 2010/0259971 A1 Oct. 14, 2010

Related U.S. Application Data

(60) Provisional application No. 61/169,193, filed on Apr. 14, 2009.

(51) Int. Cl.
*G11C 8/00* (2006.01)

(52) U.S. Cl. ............... 365/230.05; 365/154; 365/189.11

(58) Field of Classification Search ............. 365/230.05, 365/154, 189.11
See application file for complete search history.

(56) References Cited

U.S. PATENT DOCUMENTS

| | | | |
|---|---|---|---|
| 6,538,954 B2 * | 3/2003 | Kunikiyo | 365/230.05 |
| 7,233,032 B2 | 6/2007 | Liaw | |
| 7,405,994 B2 * | 7/2008 | Liaw | 365/230.05 |
| 7,440,356 B2 * | 10/2008 | Venkatraman et al. | 365/230.05 |
| 7,492,627 B2 * | 2/2009 | Russell et al. | 365/154 |

OTHER PUBLICATIONS

Chang, L., et al., "Stable SRAM Cell Design for the 32 nm Node and Beyond," Symposium on VLSI Technology Digest of Technical Papers, 2005, pp. 128 and 129.

* cited by examiner

*Primary Examiner* — Son Dinh
(74) *Attorney, Agent, or Firm* — Slater & Matsil, L.L.P.

(57) ABSTRACT

An integrated circuit includes a two-port static random access memory (SRAM) cell, which includes a first half write-port, a second half write-port, and a read-port. The first half write-port includes a first pull-up transistor, a first pull-down transistor, and a first pass-gate transistor interconnected to each other. The second half write-port includes a second pull-up transistor, a second pull-down transistor, and a second pass-gate transistor interconnected to each other and to the first half write-port. Channel lengths of the first pass-gate transistor and the second pass-gate transistor are less than channel lengths of the first pull-down transistor and the second pull-down transistor. The read-port includes a read-port pull-down transistor connected to the first half write-port, and a read-port pass-gate transistor connected to the read-port pull-down transistor.

29 Claims, 7 Drawing Sheets

TWO-PORT 8T SRAM DESIGN

This application claims the benefit of U.S. Provisional Application No. 61/169,193 filed on Apr. 14, 2009, entitled "Two-Port 8T SRAM Design," which application is hereby incorporated herein by reference.

TECHNICAL FIELD

This invention relates generally to integrated circuit design and more particularly to the design of two-port static random access memories.

BACKGROUND

Static random access memory (SRAM) is commonly used in integrated circuits. SRAM cells have the advantageous feature of holding data without a need for refreshing. SRAM cells may include different numbers of transistors, and are often referred to by the number of transistors, for example, six-transistor (6T) SRAM, eight-transistor (8T) SRAM, and the like. The transistors typically form a data latch for storing a bit. Additional transistors may be added to control access to the transistors. SRAM cells are typically arranged as an array having rows and columns. Each row of the SRAM cells is connected to a word-line, which determines whether the current SRAM cell is selected or not. Each column of the SRAM cells is connected to a bit-line (or a pair of complementary bit-lines), which is used for writing a bit into, or reading a bit from, the SRAM cell.

When integrated on system-on-chip (SOC) applications, the conventional 6T and 8T memories face the increasing demanding requirement of reducing power consumption and increasing speed. However, in conventional 6T memories, reduction in power consumption requires the operation voltage to be reduced. This results in a cell stability concern, which is caused by reduced Vcc_min, and hence reduced static noise margin (SNM).

In addition to the above-discussed problem, the SOC applications also face another dilemma. To reduce power consumption, when in a sleep mode or a low-power mode, the operation voltage of logic circuits can be reduced or turned off to save power. However, in SOC applications, the processor (central computing unit (CPU)) cannot be turned off, and it still needs to access level-1 (L1) cache memory. Since the operation voltage of the L1 cache cannot be lowered too much due to the required SNM, the operation voltage of the processor also cannot be reduced, and hence the reduction in overall power consumption is limited.

SUMMARY OF THE INVENTION

In accordance with one aspect of the present invention, an integrated circuit includes a two-port static random access memory (SRAM) cell, which includes a first half write-port, a second half write-port and a read-port. The first half write-port includes a first pull-up transistor, a first pull-down transistor, and a first pass-gate transistor interconnected to each other. The second half write-port includes a second pull-up transistor, a second pull-down transistor, and a second pass-gate transistor interconnected to each other and to the first half write-port. Channel lengths of the first pass-gate transistor and the second pass-gate transistor are less than channel lengths of the first pull-down transistor and the second pull-down transistor. The read-port includes a read-port pull-down transistor connected to the first half write-port, and a read-port pass-gate transistor connected to the read-port pull-down transistor.

Other embodiments are also disclosed.

The advantageous features of the present invention include increased operation speed, reduced operation voltage, and hence reduced power consumption.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

A novel eight-transistor (8T) two-port static random access memory (SRAM) design is provided. The variations and the operation of the embodiment are discussed. Throughout the various views and illustrative embodiments of the present invention, like reference numbers are used to designate like elements.

Figure 1:
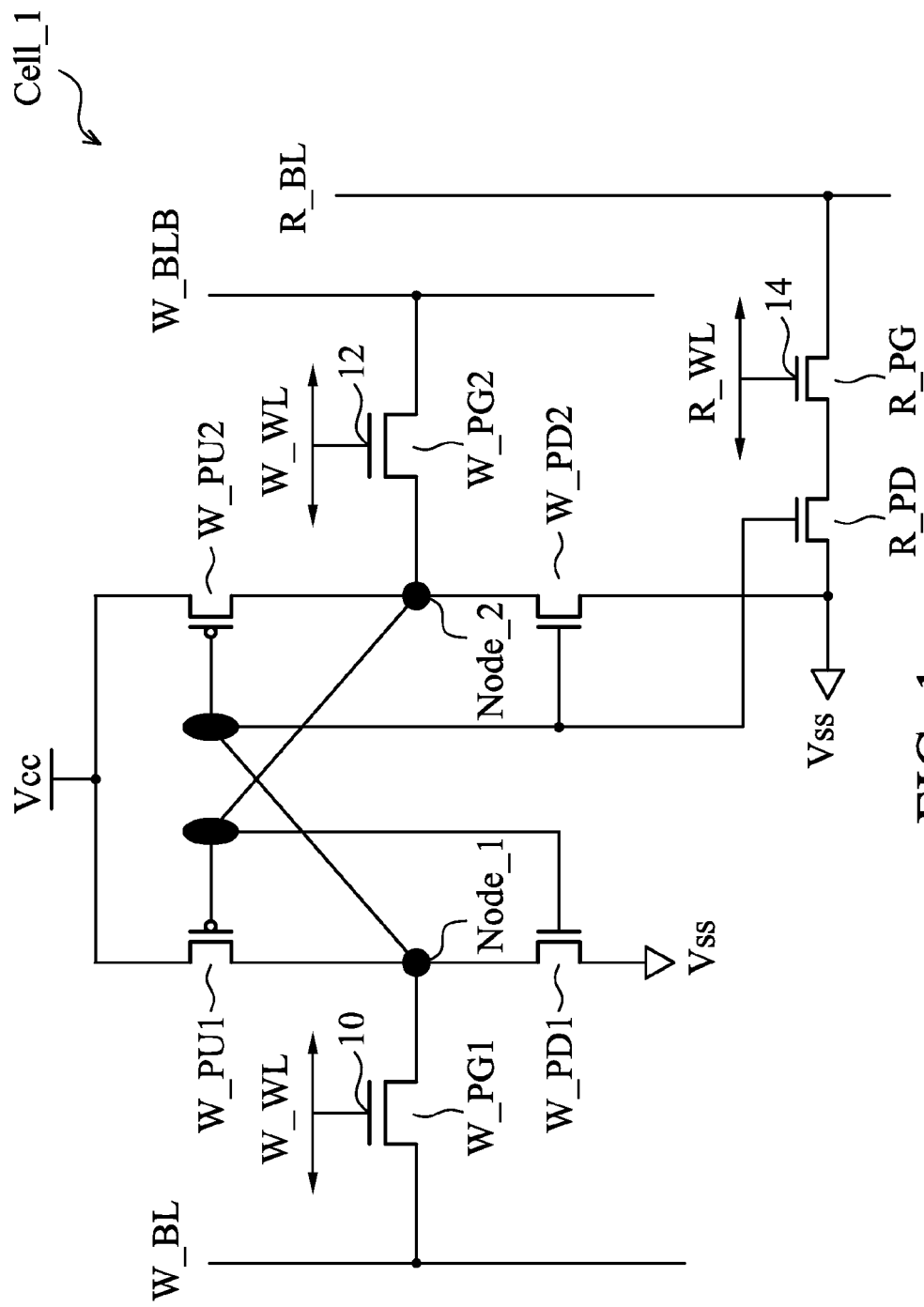
FIG. 1 illustrates an eight-transistor (8T) two-port static random access memory (SRAM) cell in accordance with an embodiment.

FIG. 1 illustrates an embodiment, which includes 8T SRAM cell Cell_1. SRAM cell Cell_1 includes write-port pull-up transistors W_PU1 and W_PU2, write-port pull-down transistors W_PD1 and W_PD2, and write-port pass-gate transistors W_PG1 and W_PG2. The drains of pull-up transistor W_PU1 and pull-down transistor W_PD1 are interconnected, and the drains of pull-up transistor W_PU2 and pull-down transistor W_PD2 are interconnected. Transistors W_PU1, W_PU2, W_PD1, and W_PD2 are cross-coupled to form a data latch. Storage node Node_1 of the data latch is coupled to write bit-line W_BL through write-port pass-gate transistor W_PG1, while storage node Node_2 is coupled to write bit-line W_BLB through write-port pass-gate transistor W_PG2, wherein storage nodes Node_1 and Node_2 are complementary nodes that are often at opposite logic levels (logic high or logic low). Gates 10 and 12 of write-port pass-gate transistors W_PG1 and W_PG2 are connected to write word-line W_WL. SRAM cell Cell_1 is coupled between operation voltages Vcc and Vss.

Transistors W_PU1, W_PU2, W_PD1, W_PD2, W_PG1, and W_PG2 (referred to as write-port transistors hereinafter) form the write-ports of SRAM cell Cell_1, wherein transistors W_PG1, W_PU1, and W_PD1 form a first half write-port, and transistors W_PG2, W_PU2, and W_PD2 form a second half write-port. The write-ports are used for writing data into SRAM cell Cell_1. The reading of the data stored in SRAM cell Cell_1 is performed through read-port pull-down transistor R_PD and read-port pass-gate transistor R_PG. Gate 14 of read-port pass-gate transistor R_PG is connected to read word-line R_WL, which is electrically and physically separated from write word-line W_WL. When write operations are performed, read-port pass-gate transistor R_PG is turned off, and write-port pass-gate transistors W_PG1 and W_PG2 are turned on. The data are thus written into SRAM cell Cell_1 through write bit-lines W_BL and W_BLB. Conversely, when read operations are performed, write-port pass-gate transistors W_PG1 and W_PG2 are turned off, and read-port pass-gate transistor R_PG is turned on. The data are thus read into read bit-line R_BL, which may be a local bit-line.

Figure 2:
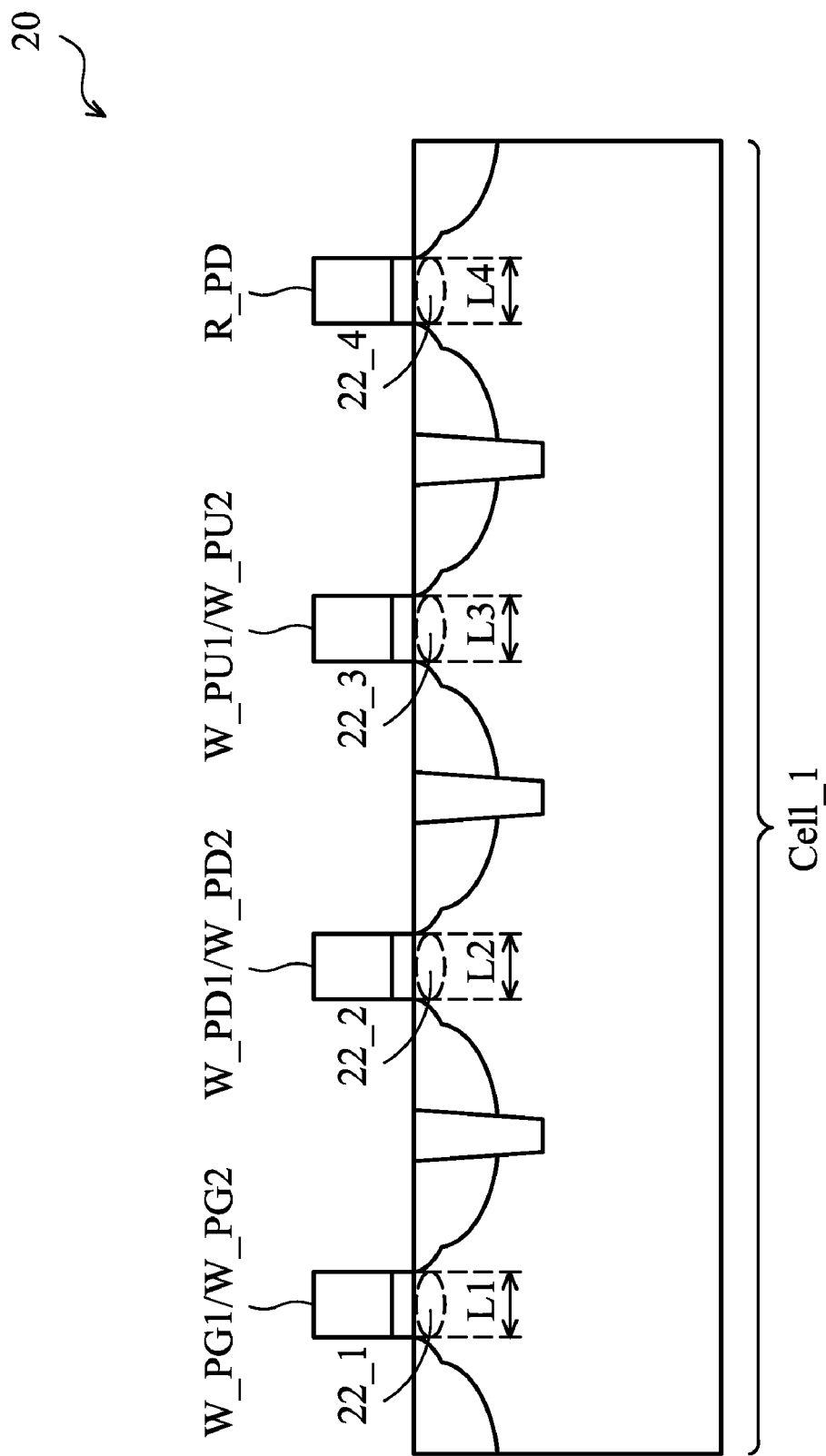
FIG. 2 illustrates a cross-sectional view of transistors shown in FIG. 1.

FIG. 2 illustrates semiconductor chip 20, in which SRAM cell Cell_1 is formed. FIG. 2 illustrates the cross-sectional views of write-port pass-gate transistors W_PG1 and/or W_PG2 (referred to as write-port pass-gate transistors W_PG1/W_PG2 hereinafter), write-port pull-down transistors W_PD1 and/or W_PD2 (referred to as write-port pull-down transistors W_PD1/W_PD2 hereinafter), write-port pull-up transistors W_PU1 and/or W_PU2 (referred to as write-port pull-up transistors W_PU1/W_PU2 hereinafter), and read-port pull-down transistor R_PD. In reality, the cross-sectional views of the illustrated transistors may not be, although they are illustrated as being, in a same plane. Channels 22_1, 22_2, 22_3, and 22_4, which have channel lengths L1, L2, L3, and L4, respectively, are also illustrated. In an embodiment, channel length L1 of write-port pass-gate transistors W_PG1/W_PG2 is smaller than channel length L2 of write-port pull-down transistors W_PD1/W_PD2. In an exemplary embodiment, a ratio of channel length L1 to channel length L2 (L1/L2) is less than about 0.95, or even less than about 0.9. Also, channel length L1 may be smaller than channel length L3 of write-port pull-up transistors W_PU1/W_PU2. In an exemplary embodiment, a ratio of channel length L1 to channel length L3 (L1/L3) is less than about 0.95, or even less than about 0.85. On the other hand, channel lengths L2 and L3 may be equal to each other, although they can also be different from each other. Further, channel width W1 (not shown in FIG. 2, please refer to FIG. 6) of write-port pass-gate transistors W_PG1/W_PG2 may be equal to (or substantially equal to with less than about 5 percent difference), greater than, or smaller than, channel width W2 of write-port pull-down transistors W_PD1/W_PD2.

With the channel length L1 of transistors W_PG1/W_PG2 being smaller than channel lengths L2 and L3 of transistors W_PD1/W_PD2 and/or W_PU1/W_PU2, the drivability of write-port pass-gate transistors W_PG1/W_PG2 is increased, and hence write-speed is increased. It is realized that with the reduction in ratios L1/L2 and L1/L3, SRAM cell Cell_1 appears to have a smaller static noise margin (SNM). However, as will be discussed in subsequent paragraphs, the design of the SRAM array does not adopt column multiplexers (MUX), and hence no dummy read occurs during write/read operations. Accordingly, when write/read operations are performed to some selected SRAM cells, write-port pass-gate transistors W_PG1/W_PG2 of unselected SRAM cells on a same row as the selected cells are turned off, and hence the unselected cells are not affected by the static noise, and do not have the concern of an erroneous flip. In addition, with the write-ports of SRAM cell Cell_1 not affected by the static noise in write/read operations of other cells, the Vcc_min (and hence operation voltage Vcc) of SRAM cell Cell_1 may be reduced without causing an erroneous read or write. In an embodiment, the operation voltage Vcc may be reduced to the same operation voltage of logic circuits, as is symbolized by logic transistor LT as in FIG. 3A.

Referring again to FIG. 2, channel length L4 of read-port pull-down transistor R_PD may be smaller than channel length L2 of write-port pull-down transistors W_PD1/W_PD2. In an exemplary embodiment, a ratio of channel length L4 to channel length L2 (L4/L2) is less than about 0.9, or even less than about 0.85. On the other hand, channel width W4 (not shown in FIG. 2, please refer to FIG. 6) of transistor R_PD may be equal to or greater than channel length W2 of transistors W_PD1/W_PD2. With the reduction in ratio L4/L2, the read-port pull-down transistor R_PD is stronger, and hence the read operations are faster.

Figure 3A:
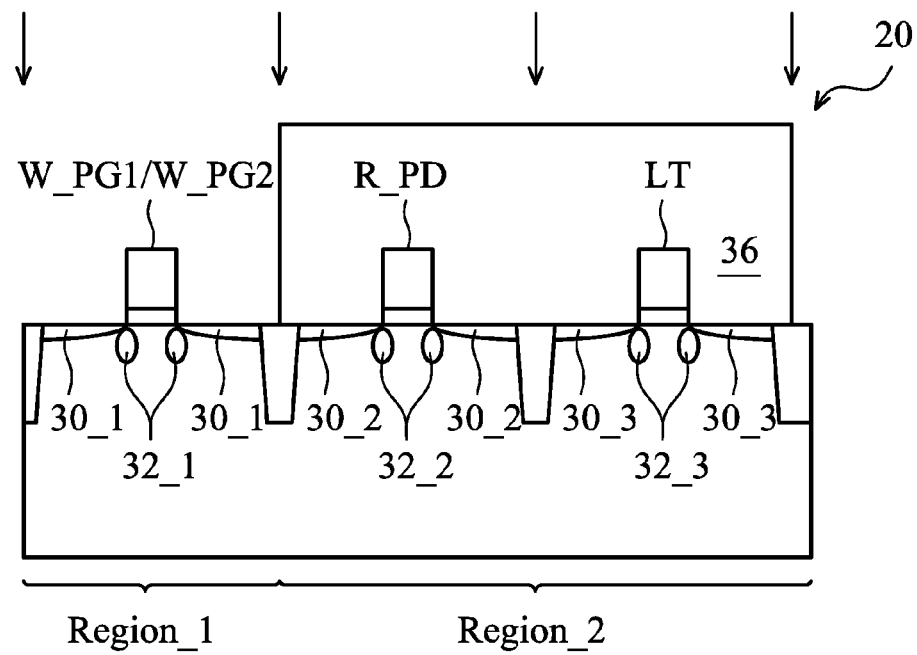
FIG. 3A illustrates a cross-sectional view of an intermediate stage in the formation of the SRAM transistors.

To further improve the performance of SRAM cell Cell_1, the formation process of the transistors in SRAM cell Cell_1 may be optimized. FIG. 3A illustrates a cross-sectional view of an intermediate stage in the formation of SRAM cell Cell_1, which is a portion of chip 20. FIG. 3A illustrates write-port pass-gate transistors W_PG1/W_PG2 and corresponding source/drain extension (SDE) regions 30_1 and pocket regions 32_1, read-port pull-down transistor R_PD and corresponding SDE regions 30_2 and pocket regions 32_2, and logic transistor LT and corresponding SDE regions 30_3 and pocket regions 32_3. Logic transistor LT may be in a peripheral circuit (for example, a control circuit of the SRAM cells in chip 20). In an exemplary embodiment, SDE regions 30_2 and 30_3 are formed simultaneously using a same lithography mask (refer to FIG. 3B). Accordingly, SDE regions 30_2 and 30_3 (both are drawn in a same region marked as Region_2, although they may be physically separated from each other) are implanted with the same dosage, and have the same doping concentration. SDE regions 30_1 (in a region marked as Region_1), on the other hand, are formed using a different lithography mask (refer to FIG. 3C) as the lithography mask for forming SDE regions 30_2 and 30_3 (in a region marked as Region_2). In an exemplary embodiment, the doping concentration/dosage of SDE regions 30_1 may be lower than the doping concentration/dosage of SDE regions 30_2 and 30_3 by about 20 percent.

Figure 3B:
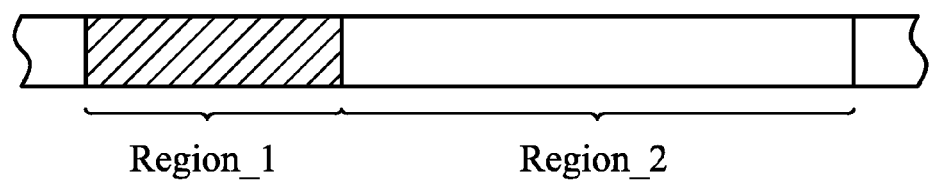
FIGS. 3B and 3C schematically illustrate lithography masks used for performing the steps for forming the structure as shown in FIG. 3A.

Similarly, pocket regions 32_2 and 32_3 may be formed simultaneously using a same lithography mask (refer to FIG. 3B). Accordingly, pocket regions 32_2 and 32_3 are implanted with the same dosage, and have the same doping concentration. Pocket regions 32_1, on the other hand, are formed using a different lithography mask (refer to FIG. 3C) as the mask for forming pocket regions 32_2 and 32_3. In an exemplary embodiment, the doping concentration/dosage of pocket regions 32_1 may be greater than the doping concentration/dosage of pocket regions 32_2 and 32_3 by about 20 percent. As a result, the threshold voltage of read-port pull-down transistor R_PD may be lower than the threshold voltages of write-port pass-gate transistors W_PG1/W_PG2.

Figure 3C:
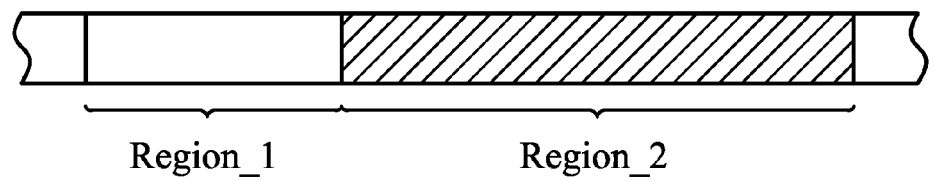

FIGS. 3B and 3C illustrate exemplary lithography masks, which have a transparent portion for allowing light to pass and opaque patterns for blocking the light. Lithography masks are used, for example, for making photo resist patterns (for example, photo resist 36 in FIG. 3A) that are used in the formation of the SDE regions and pocket regions as shown in FIG. 3A. It is realized that there exist positive photo resists and negative photo resists, and hence the patterns (corresponding to regions Region_1 and Region_2) in FIGS. 3B and 3C may be reversed if different types of photo resists are used. Regions Region_1 and Region_2 in FIGS. 3B and 3C correspond to the same regions in FIG. 3A. It is observed that the portions of the lithography masks corresponding to logic transistor LT and read-port pull-down transistor R_PD have a same pattern (either transparent or opaque), while the portion corresponding to write-port pass-gate transistors W_PG1/W_PG2 have a reversed pattern.

Figure 4:
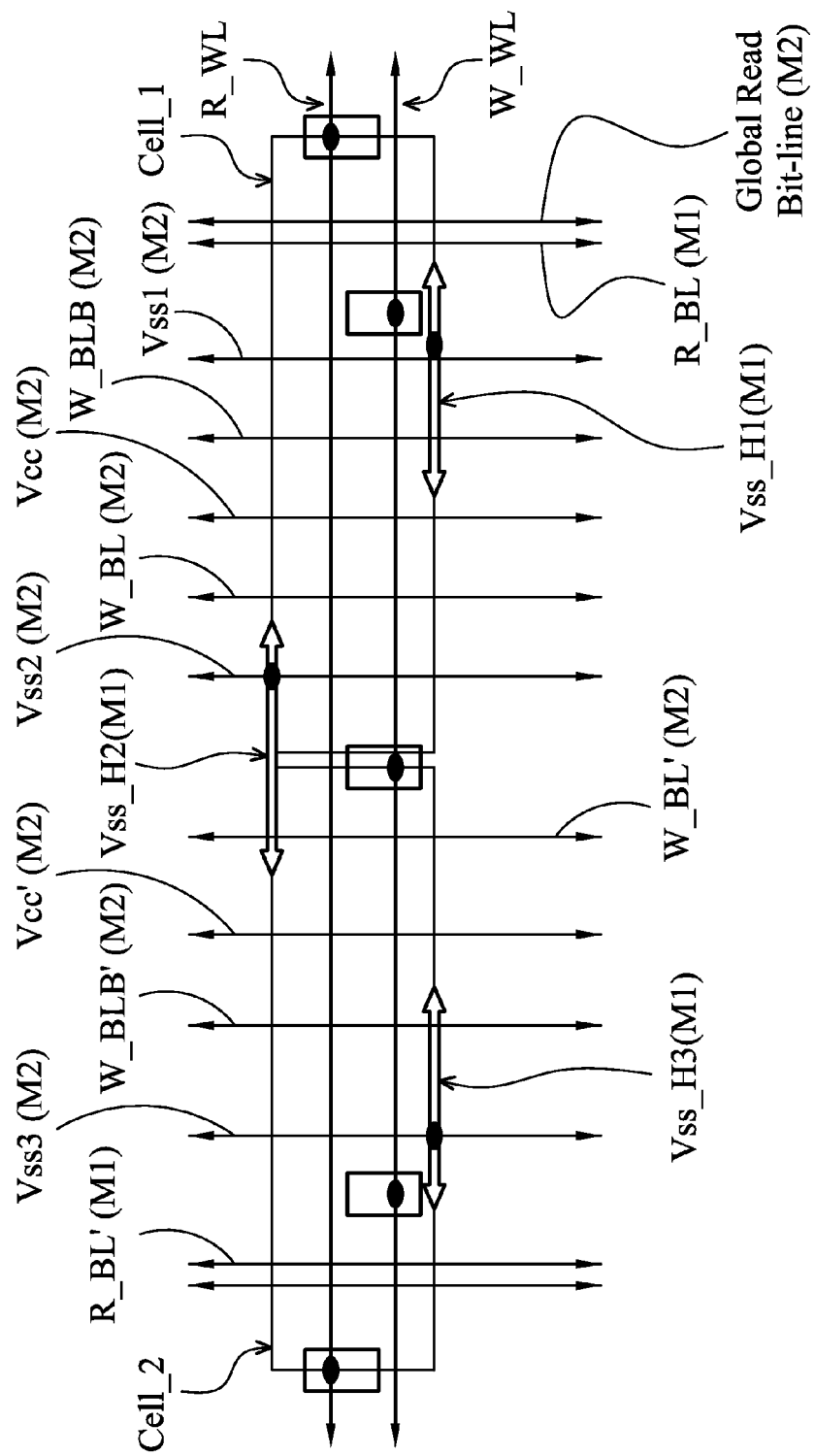
FIG. 4 illustrates the distribution of metal lines connected to SRAM cells.

FIG. 4 illustrates the metal line routing of SRAM cells, wherein the metal lines connected to SRAM cells Cell_1 and Cell_2 are illustrated, and the boundaries of SRAM cells Cell_1 and Cell_2 are also illustrated to clearly show the boundaries. SRAM cells Cell_1 and Cell_2 are illustrated as having a small gap therebetween, although they may adjoin each other in reality. SRAM cells Cell_1 and Cell_2 are in a same row (in the word-line direction), and are in neighboring columns. Accordingly, they are connected to the same read word-line R_WL and the same write word-line W_WL. SRAM cell Cell_1 (and the respective column) is connected to write bit-lines W_BL and W_BLB. SRAM cell Cell_2 (and the respective column) is connected to write bit-lines W_BL' and W_BLB'.

Figure 5:
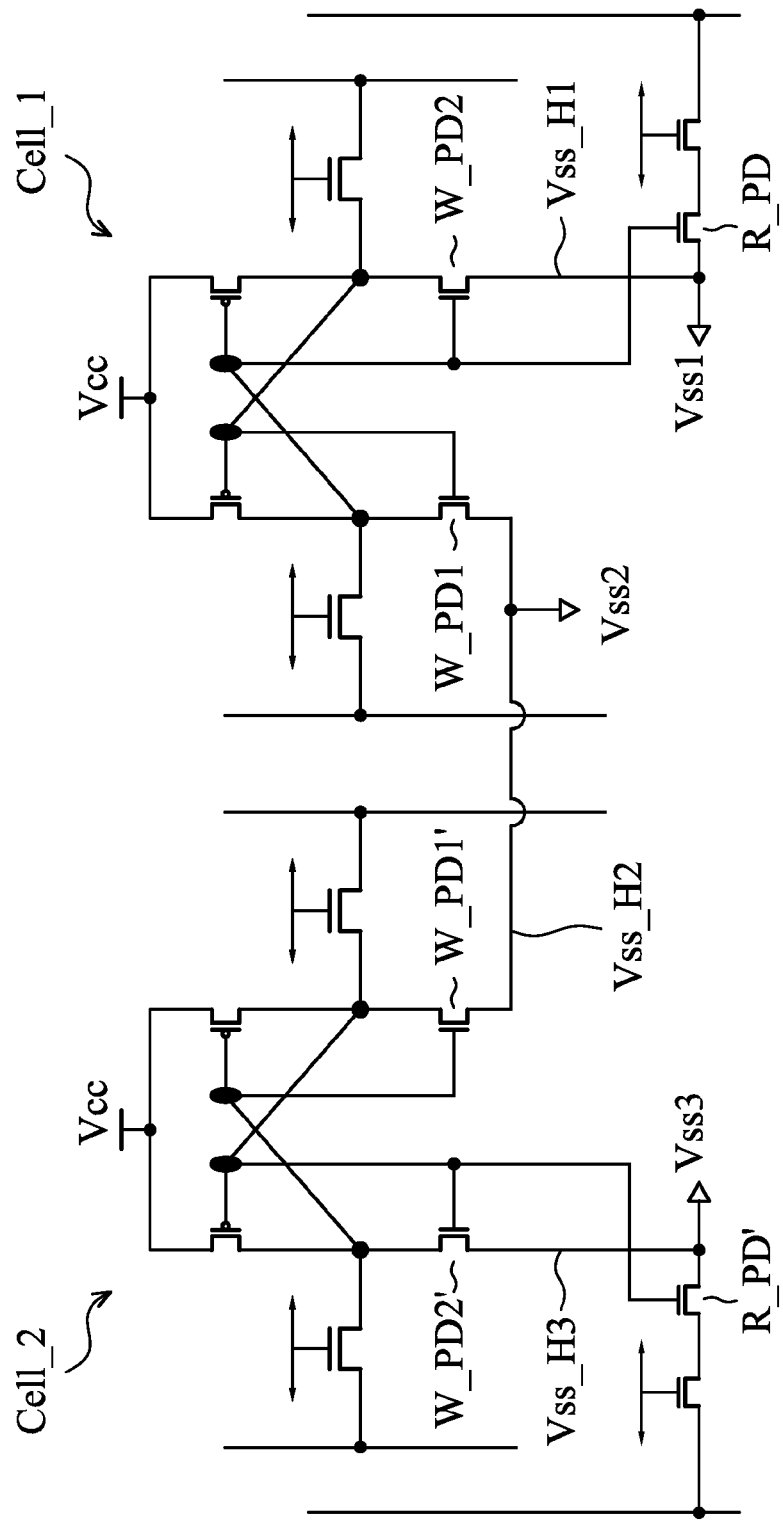
FIG. 5 illustrates two neighboring SRAM cells and corresponding horizontal VSS lines.

Further, each pair of neighboring columns shares three vertical (in the column direction) Vss lines Vss1, Vss2, and Vss3, which extend in the column direction. The first vertical Vss line Vss1 is for SRAM cell Cell_1 (and the respective column) only, and is connected to the source of the write-port pull-down transistor W_PD2 and the source of read-port pull-down transistor R_PD (refer to FIG. 5), which connection is shown as a short horizontal (parallel to the word-line direction, which is the row direction) metal line Vss_H1, and is in the bottom metallization layer (commonly known as M1). Horizontal metal line Vss_H1 is connected to vertical Vss line Vss1, which connects all SRAM cells in the same column. The second vertical Vss line Vss2 is connected to the sources of write-port pull-down transistors W_PD1 and W_PD1' (see FIG. 5), and hence are shared by SRAM cells Cell_1 and Cell_2. The connection between the sources of write-port pull-down transistors W_PD1 and W_PD1' is made using a short horizontal line Vss_H2 in M1, which is also shown in FIG. 5. The third vertical Vss line Vss3 is for SRAM cell Cell_2 (and the respective column) only, and is connected to the source of write-port pull-down transistor W_PD2' and the source of read-port pull-down transistor R_PD' (refer to FIG. 5), which connection is shown as a short horizontal (in the word-line direction) metal line Vss_H3, and is in the M1. Metal line Vss_H3 is connected to vertical Vss line Vss3, which connects all SRAM cells in the same column. Vertical Vss lines Vss1, Vss2, Vss3, Vcc, Vcc', and global bit-lines (if any) may be in the metallization layer (commonly known as M2) immediately over metallization layer M1.

Write bit-lines W_BL, W_BLB, W_BL', and W_BLB' are separated, and hence are shielded, from each other by metal lines Vcc, Vcc', vertical Vss lines Vss1, Vss2, Vss3, and the landing pads for connecting write word-line W_WL to the gates of write-port pass-gate transistors W_PG1 and W_PG2. FIG. 5 illustrates a circuit diagram of SRAM cells Cell_1 and Cell_2, wherein horizontal bit-lines Vss_H1, Vss_H2, and Vss_H3 are illustrated.

Figure 6:
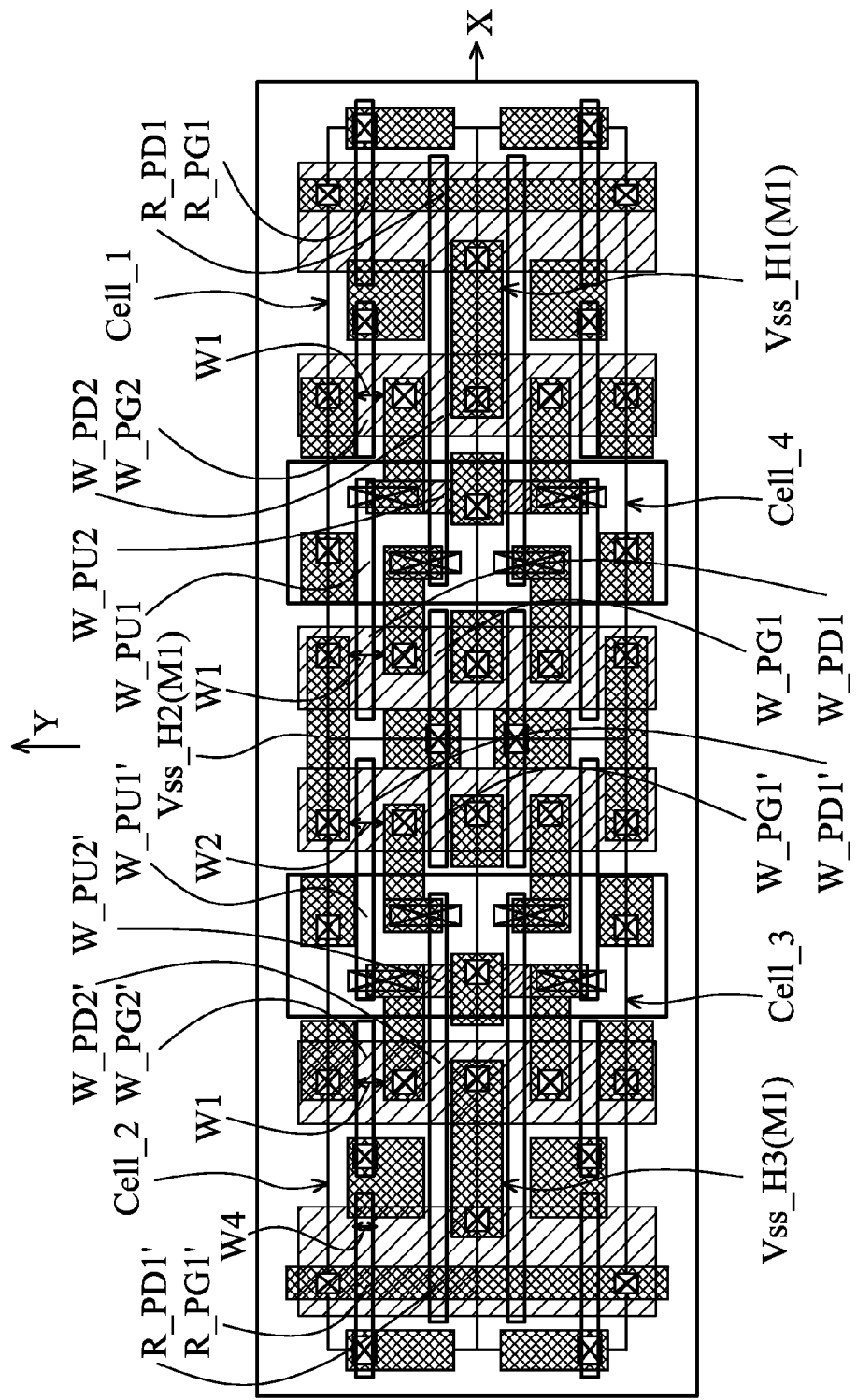
FIG. 6 illustrates an exemplary layout of four neighboring SRAM cells.

FIG. 6 illustrates an exemplary layout showing four SRAM cells, SRAM cells Cell_1, Cell_2, and additional SRAM cells Cell_3, Cell_4. The four SRAM cells are symmetric relative to both an X axis and a Y axis. For example, SRAM cells Cell_1 and Cell_2 are symmetric relative to the Y axis, while SRAM cells Cell_1 and Cell_4 are symmetric relative to the X axis. The transistors in SRAM cells Cell_1 and Cell_2 are marked with corresponding reference indicators. The three horizontal Vss metal lines Vss_H1, Vss_H2, and Vss_H3 are also illustrated. FIGS. 4, 5, and 6 may be compared for the understanding of the embodiments of the present invention.

Figure 7:
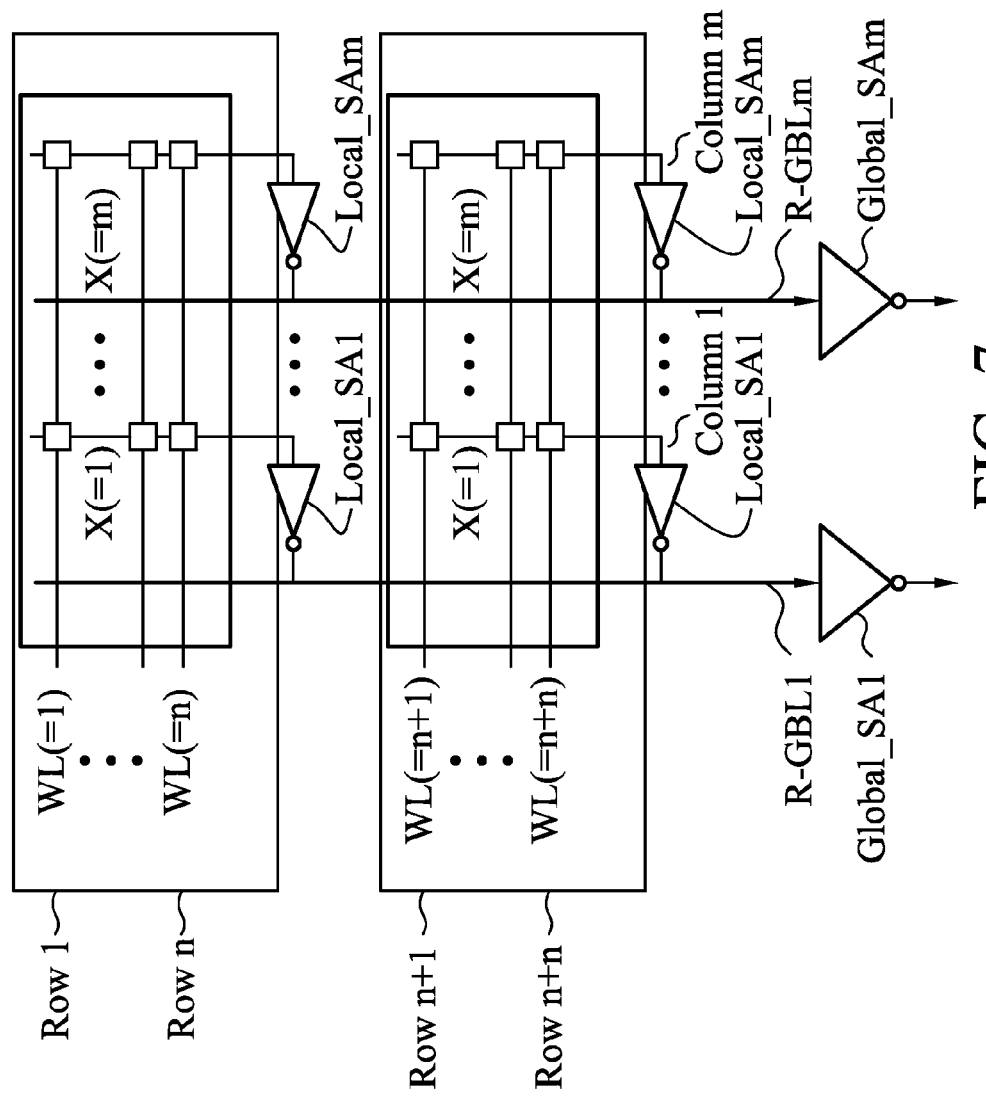
FIG. 7 illustrates an SRAM array.

FIG. 7 illustrates an exemplary SRAM array comprising a plurality of rows (from row 1 to row 2n) and a plurality of columns (from column 1 to column m). In an embodiment, no column MUX is used. Accordingly, a plurality of word-lines connected to the same write word-line W_WL and the same read word-line R_WL (not shown in FIG. 7, please refer to FIGS. 1 and 4) are read from (and written into) simultaneously. Therefore, no dummy read will occur. This results in a reduction in the Vcc_min, for example, to the same operation voltage of logic devices without the stability concern. In an embodiment, the rows of the SRAM array are divided into different groups, wherein in each column and each group, a local bit-line is connected to a local sense amplifier (Local_SA1 through Local_SAm). The outputs of the local sense amplifiers in different groups (but connected to a same column) are connected to a same global bit-line, for example, R_GBL1 through R_GBLm. The signal on the global bit-lines may be further amplified by global sense amplifiers such as Global_SA1 through Global_SAm. In alternative embodiments, no global bit-lines are provided, and each read bit-line R_BL (FIGS. 1 and 4) is connected to all SRAM cells in the same column, and is connected to a sense amplifier.

The embodiments of the present invention have several advantageous features. By increasing the ratios L1/L2 and L1/L3 (refer to FIG. 2), both write and read operations of SRAM cells are strengthened, and the write and read speeds are improved. On the other hand, the operation voltages of the SRAM cells can be reduced without degrading the stability of the SRAM cells. The operation voltage may be reduced to the same operation voltage of logic circuits. This is particularly advantageous for being used in level-1 (L1) cache memory, which, when operated under the same operation voltage as processors (CPUs), can significantly reduce the power consumption in low-power mode.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit comprising:
   a two-port static random access memory (SRAM) cell comprising:
      a first half write-port comprising a first pull-up transistor, a first pull-down transistor, and a first pass-gate transistor interconnected to each other;
      a second half write-port comprising a second pull-up transistor, a second pull-down transistor, and a second pass-gate transistor interconnected to each other and to the first half write-port, wherein channel lengths of the first pass-gate transistor and the second pass-gate transistor are less than channel lengths of the first pull-down transistor and the second pull-down transistor; and a read-port comprising a read-port pull-down transistor connected to the first half write-port, and a read-port pass-gate transistor connected to the read-port pull-down transistor.

2. The integrated circuit of claim 1, wherein the channel lengths of the first pass-gate transistor and the second pass-gate transistor are less than channel lengths of the first pull-up transistor and the second pull-up transistor.

3. The integrated circuit of claim 1, wherein a ratio of the channel length of the first pass-gate transistor to the channel length of the first pull-down transistor is less than about 95%.

4. The integrated circuit of claim 1, wherein a channel length of the read-port pull-down transistor is less then the channel lengths of the first pull-down transistor and the second pull-down transistor.

5. The integrated circuit of claim 1, wherein channel widths of the first pass-gate transistor and the second pass-gate transistor are substantially equal to channel widths of the first pull-down transistor and the second pull-down transistor.

6. The integrated circuit of claim 1 further comprising:
a first Vss line connected to a source of the first pull-down transistor and a source of the read-port pull-down transistor; and
a second Vss line connected to a source of the second pull-down transistor and a source of a second pull-down transistor of a neighboring SRAM cell identical to the two-port SRAM cell, wherein the first Vss line and the second Vss line are parallel to, and physically separated from, each other.

7. The integrated circuit of claim 1 further comprising:
a complementary pair of write bit-lines connected to the first pass-gate transistor and the second pass-gate transistor; and
a read bit-line connected to the read-port pass-gate transistor.

8. An integrated circuit comprising:
a two-port static random access memory (SRAM) array comprising SRAM cells arranged in rows and columns, wherein each of the SRAM cells comprises:
a first half write-port comprising a first pull-up transistor, a first pull-down transistor, and a first pass-gate transistor interconnected to each other;
a second half write-port comprising a second pull-up transistor, a second pull-down transistor, and a second pass-gate transistor interconnected to each other and to the first half write-port, wherein channel lengths of the first pass-gate transistor and the second pass-gate transistor are less than channel lengths of the first pull-up transistor and the second pull-up transistor; and
a read-port comprising a read-port pull-down transistor connected to one of the first half write-port and the second half write-port, and a read-port pass-gate transistor connected to the read-port pull-down transistor.

9. The integrated circuit of claim 8 further comprising a plurality of Vss lines extending in a column direction of the SRAM array, wherein a pair of neighboring columns shares three of the plurality of Vss lines.

10. The integrated circuit of claim 9, wherein the plurality of Vss lines are in a second metallization layer (M2) immediately over a bottom metallization layer (M1), and wherein the three of the plurality of Vss lines comprise:
a first vertical Vss line coupled to a source of a first pull-down transistor and a source of a read-port pull-down transistor of a first SRAM cell;
a second vertical Vss line coupled to a source of the first pull-down transistor and a source of the read-port pull-down transistor of a second SRAM cell neighboring the first SRAM cell; and
a third vertical Vss line coupled to a source of a second pull-down transistor of the first SRAM cell and a source of a second pull-down transistor of the second SRAM cell.

11. The integrated circuit of claim 8, wherein the integrated circuit further comprises:
a first horizontal Vss line directly over a first SRAM cell of the SRAM cells and in a bottom metallization layer (M1), wherein the first horizontal Vss line connects a source of the first pull-down transistor to a source of the read-port pull-down transistor of the first SRAM cell;
a second horizontal Vss line directly over a second SRAM cell of the SRAM cells neighboring the first SRAM cell and in the M1, wherein the second horizontal Vss line connects a source of a first pull-down transistor and a source of a read-port pull-down transistor of the second SRAM cell; and
a third horizontal Vss line extending from directly over the first SRAM cell to directly over the second SRAM cell and in the M1, wherein the third horizontal Vss line connects a source of a second pull-down transistor of the first SRAM cell to a source of a second pull-down transistor of the second SRAM cell.

12. The integrated circuit of claim 8 further comprising:
a complementary pair of write bit-lines connected to first pass-gate transistors and second pass-gate transistors of SRAM cells in a same column; and
a read bit-line connected to read pass-gate transistors of the SRAM cells in the same column.

13. The integrated circuit of claim 12, wherein no bit-line column multiplexer is connected to the columns of the SRAM array.

14. The integrated circuit of claim 12 further comprising a plurality of write word-lines and a plurality of read word-lines, wherein each of the rows of the SRAM cells is connected to one of the plurality of write word-lines and one of the plurality of read word-lines.

15. The integrated circuit of claim 14, wherein all SRAM cells connected to a same one of the plurality of write bit-lines are configured to be read from simultaneously.

16. The integrated circuit of claim 8, wherein the channel lengths of the first pass-gate transistor and the second pass-gate transistor are less than channel lengths of the first pull-down transistor and the second pull-down transistor.

17. The integrated circuit of claim 16, wherein a ratio of the channel length of the first pass-gate transistor to the channel length of the first pull-down transistor is less than about 95%.

18. The integrated circuit of claim 8, wherein a channel length of the read-port pull-down transistor is less than channel lengths of the first pull-down transistor and the second pull-down transistor.

19. An integrated circuit comprising:
a two-port static random access memory (SRAM) array comprising SRAM cells arranged in rows and columns, wherein each of the SRAM cells comprises:
a first half write-port comprising a first pull-up transistor, a first pull-down transistor, and a first pass-gate transistor interconnected to each other;

a second half write-port comprising a second pull-up transistor, a second pull-down transistor, and a second pass-gate transistor interconnected to each other and to the first half write-port; and a read-port comprising a read-port pull-down transistor connected to the first half write-port, and a read-port pass-gate transistor connected to the read-port pull-down transistor; and a plurality of Vss lines extending in a column direction of the SRAM array, wherein a pair of neighboring columns shares three of the plurality of Vss lines.

20. The integrated circuit of claim 19, wherein the three of the plurality of Vss lines comprise:

a first vertical Vss line coupled to a source of a first pull-down transistor and a source of a read-port pull-down transistor of a first SRAM cell of the SRAM cells;

a second vertical Vss line coupled to a source of a first pull-down transistor and a source of a read-port pull-down transistor of a second SRAM cell of the SRAM cells and neighboring the first SRAM cell; and a third vertical Vss line coupled to a source of a second pull-down transistor of the first SRAM cell and a source of a second pull-down transistor of the second SRAM cell.

21. The integrated circuit of claim 19, wherein the integrated circuit further comprises:

a first horizontal Vss line directly over a first SRAM cell of the SRAM cells and in a bottom metallization layer (M1), wherein the first horizontal Vss line connects a source of a first pull-down transistor to a source of a read pull-down transistor of the first SRAM cell;

a second horizontal Vss line connected to a source of a first pull-down transistor and a source of a read pull-down transistor of a second SRAM cell of the SRAM cells and neighboring the first SRAM cell, wherein the second horizontal Vss line is directly over the second SRAM cell and in the M1; and a third horizontal Vss line extending from directly over the first SRAM cell to directly over the second SRAM cell and in the M1, wherein the third horizontal Vss line connects a source of a second pull-down transistor of the first SRAM cell to a source of a second pull-down transistor of the second SRAM cell, and wherein the first horizontal Vss line, the second horizontal Vss line, and the third horizontal Vss line are parallel to each other and extend in a word-line direction.

22. The integrated circuit of claim 21, wherein the plurality of Vss lines is in a second metallization layer (M2) immediately over the M1.

23. The integrated circuit of claim 19, wherein channel lengths of the first pass-gate transistor and the second pass-gate transistor are less than channel lengths of the first pull-down transistor and the second pull-down transistor.

24. The integrated circuit of claim 19 further comprising:

a plurality of write word-lines extending in a row direction; and a plurality of read word-lines extending in the row direction, wherein each of the rows of the SRAM array is connected to one of the plurality of write word-lines and one of the plurality of read word-lines.

25. A method of forming an integrated circuit, the method comprising:

forming a two-port static random access memory (SRAM) cell comprising:

forming a first pull-up transistor and a second pull-up transistor;

forming a first pull-down transistor and a second pull-down transistor;

forming a first pass-gate transistor and a second pass-gate transistor, wherein the first pull-up transistor, the first pull-down transistor, and the first pass-gate transistor are interconnected to each other to form a first half write-port, and wherein the second pull-up transistor, the second pull-down transistor, and the second pass-gate transistor are interconnected to each other to form a second half write-port;

forming a read-port comprising forming a read-port pull-down transistor connected to the first half write-port, and forming a read-port pass-gate transistor connected to the read-port pull-down transistor; and forming a logic transistor, wherein at least one of a first source/drain extension (SDE) region and a first pocket region of the read-port pull-down transistor is formed simultaneously with a second SDE region and a second pocket region of the logic transistor, and at a different time than forming a third SDE region and a third pocket region of the first pull-down transistor.

26. The method of claim 25, wherein the first SDE region and the second SDE region are formed using a first lithography mask, and wherein the third SDE region is formed using a second lithography mask different from the first lithography mask.

27. The method of claim 25, wherein the first pocket region and the second pocket region are formed using a first lithography mask, and wherein the third pocket region is formed using a second lithography mask different from the first lithography mask.

28. The method of claim 25, wherein the first pocket region and the second pocket region have a lower doping concentration than the third pocket region.

29. The method of claim 25, wherein the first SDE region and the second SDE region have a greater doping concentration than the third SDE region.

* * * * *